(12) United States Patent
Zeng et al.

(10) Patent No.: US 11,574,772 B2
(45) Date of Patent: Feb. 7, 2023

(54) TRANSFORMER AND ASSEMBLING METHOD THEREOF

(71) Applicant: Delta Electronics (Shanghai) CO., LTD, Shanghai (CN)

(72) Inventors: Yong Zeng, Shanghai (CN); Jianxing Dong, Shanghai (CN); Qiang Wang, Shanghai (CN); Weijun Wang, Shanghai (CN); Teng Liu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 137 days.

(21) Appl. No.: 16/836,833

(22) Filed: Mar. 31, 2020

(65) Prior Publication Data
US 2020/0312547 A1 Oct. 1, 2020

(30) Foreign Application Priority Data

Apr. 1, 2019 (CN) .......................... 201910258583.0

(51) Int. Cl.
| | | |
|---|---|---|
| *H01F 41/00* | (2006.01) | |
| *H01F 27/02* | (2006.01) | |
| *H01F 27/26* | (2006.01) | |
| *H05K 5/06* | (2006.01) | |
| *H01F 41/02* | (2006.01) | |

(Continued)

(52) U.S. Cl.
CPC ......... *H01F 41/005* (2013.01); *H01F 27/022* (2013.01); *H01F 27/26* (2013.01); *H01F 27/2823* (2013.01); *H01F 41/0246* (2013.01); *H01F 41/127* (2013.01); *H05K 5/06* (2013.01)

(58) Field of Classification Search
CPC ...... H01F 41/005; H01F 27/022; H01F 27/26; H05K 5/06
See application file for complete search history.

(56) References Cited

U.S. PATENT DOCUMENTS

| | | | |
|---|---|---|---|
| 3,201,728 A | | 8/1965 | McWhirter |
| 3,336,552 A | * | 8/1967 | Davis ...................... H01F 41/10 174/521 |

(Continued)

FOREIGN PATENT DOCUMENTS

| | | |
|---|---|---|
| CN | 1155742 A | 7/1997 |
| CN | 2318698 Y | 5/1999 |

(Continued)

OTHER PUBLICATIONS

The Notice of Allowance dated Feb. 8, 2022 for CN patent application No. 201910257895X.

(Continued)

*Primary Examiner* — Elvin G Enad
*Assistant Examiner* — Malcolm Barnes
(74) *Attorney, Agent, or Firm* — Qinghong Xu

(57) ABSTRACT

A transformer comprises at least two windings and each of the at least two windings includes at least one lead-out wire, and a silicone rubber heat-shrinkable sleeve is wrapped around the outer surface of the lead-out wire. The at least two windings and a portion of the silicone rubber heat-shrinkable sleeve are encapsulated in a potting box with a first potting sealant, and another portion of the silicone rubber heat-shrinkable sleeve is exposed outside of the potting box.

14 Claims, 13 Drawing Sheets

(51) Int. Cl.
 *H01F 27/28* (2006.01)
 *H01F 41/12* (2006.01)

(56) References Cited

U.S. PATENT DOCUMENTS

| | | | | |
|---|---|---|---|---|
| 3,569,884 | A | * | 3/1971 | Wright .................. H01F 41/127 336/96 |
| 3,662,461 | A | * | 5/1972 | Lake ..................... H01F 41/125 29/605 |
| 3,665,288 | A | * | 5/1972 | Godawski ............... H01F 38/42 315/411 |
| 3,947,795 | A | * | 3/1976 | Donnelly ............. H01F 27/306 336/84 R |
| 4,236,134 | A | * | 11/1980 | Alber .................... H01F 27/022 336/107 |
| 6,084,354 | A | | 7/2000 | Kohmura et al. |
| 7,528,693 | B2 | | 5/2009 | Burkhardt et al. |
| 8,436,711 | B2 | | 5/2013 | Rohl et al. |
| 9,437,356 | B2 | | 9/2016 | Kramer et al. |
| 9,786,425 | B2 | | 10/2017 | Sakaguchi et al. |
| 2013/0015933 | A1 | | 1/2013 | Yen et al. |
| 2014/0327507 | A1 | | 11/2014 | Tsuchiya et al. |
| 2015/0213938 | A1 | | 7/2015 | Sakaguchi et al. |
| 2018/0075964 | A1 | | 3/2018 | Suzuki et al. |
| 2019/0080837 | A1 | * | 3/2019 | Kostakis ................. H01F 41/12 |

FOREIGN PATENT DOCUMENTS

| | | | |
|---|---|---|---|
| CN | 1222746 | A | 7/1999 |
| CN | 2373878 | Y | 4/2000 |
| CN | 2390267 | Y | 8/2000 |
| CN | 1292925 | A | 4/2001 |
| CN | 2716984 | Y | 8/2005 |
| CN | 201138602 | Y | 10/2008 |
| CN | 101777416 | B | 12/2011 |
| CN | 102548313 | A | 7/2012 |
| CN | 202473576 | U | 10/2012 |
| CN | 203277022 | U | 11/2013 |
| CN | 103050248 | B | 11/2015 |
| CN | 205016329 | U | 2/2016 |
| CN | 205069302 | U | 3/2016 |
| CN | 105810391 | A | 7/2016 |
| CN | 105810391 | A * | 7/2016 |
| CN | 105810418 | A | 7/2016 |
| CN | 105810418 | A * | 7/2016 |
| CN | 205384930 | U | 7/2016 |
| CN | 205723063 | U | 11/2016 |
| CN | 106229137 | A | 12/2016 |
| CN | 205789465 | U | 12/2016 |
| CN | 106449048 | A | 2/2017 |
| CN | 106653327 | A | 5/2017 |
| CN | 105632712 | B | 8/2017 |
| CN | 206595135 | U | 10/2017 |
| CN | 107331493 | A | 11/2017 |
| CN | 206947141 | U | 1/2018 |
| CN | 105206393 | B | 2/2018 |
| CN | 207409363 | U | 5/2018 |
| CN | 109166697 | A | 1/2019 |
| EP | 2706549 | A1 * | 3/2014 ......... B29C 33/0016 |
| WO | 9427304 | A1 | 11/1994 |
| WO | 2018007514 | A1 | 1/2018 |
| WO | 2018135357 | | 7/2018 |

OTHER PUBLICATIONS

The 1st Office Action dated Mar. 19, 2021 by the CNIPA from application No. 201910257896.4.
The 1st Office Action dated Apr. 6, 2021 by the CNIPA from application No. 201910257895.X.
The 2nd Office Action dated Aug. 17, 2021 for CN patent application No. 201910257896.4.
The 2nd Office Action dated Sep. 10, 2021 for CN patent application No. 201910257895.X.
The 1st Office Action dated Apr. 16, 2021 from CN patent application No. 201910258583.0.
Non-Final Rejection dated Jul. 20, 2022 of U.S. Appl. No. 16/835,304.
Non-Final Rejection dated Jul. 21, 2022 of U.S. Appl. No. 16/835,764.

* cited by examiner

TRANSFORMER AND ASSEMBLING METHOD THEREOF

CROSS-REFERENCE TO RELATED APPLICATIONS

This application is based upon and claims priority to Chinese Patent Application No. 201910258583.0, filed Apr. 1, 2019, the entire contents of which are incorporated herein by reference.

TECHNICAL FIELD

The present disclosure generally relates to the field of electrical equipment, and more particularly, to a transformer having improved mechanical performance and reliability of high-voltage lead-out wires and an assembling method thereof.

BACKGROUND

With the rapid development of new power grid technologies, e.g. smart grids and energy Internet, the relevant technical research on power electronic transformers that can achieve multiple functions, e.g. transformer, electrical isolation, power regulation and control, and recycle energy sources, has brought to the attention. However, in large scale promoting and applying power electronic transformers, many problems need to be solved, such as core components for achieving electrical isolation and voltage level conversion functions of high-voltage and high-frequency transformers.

The structure of lead-out wires of the traditional medium and high voltage transformer adopts an insulator structure to achieve the purpose of insulation and fixing the high-voltage lead-out wires. Therefore, in order to achieve the purpose of insulation, the high-voltage lead-out wires require sufficient creepage distances respectively between the iron core and low-voltage lead-out wires. However, the structure of the high-voltage lead-out wire is relatively complicated, bulky, and costly.

For medium and high-voltage transformers, the insulation of high voltage lead-out wires is a current problem due to the high level of the voltage. One end of the lead-out wire is encapsulated in a solid insulating material and another end is exposed in the air. For medium-voltage high-power power supplies having high efficiency requirements, high power density, high reliability, and low cost, the design of the insulation structure of the transformer lead-out wires is a challenge.

SUMMARY

In one embodiment of the present disclosure, a transformer comprises at least two windings and each of the at least two windings including at least one lead-out wire, and a silicone rubber heat-shrinkable sleeve is wrapped around the outer surface of the lead-out wire. The at least two windings and a portion of the silicone rubber heat-shrinkable sleeve are encapsulated in a potting box with a first potting sealant, and another portion of the silicone rubber heat-shrinkable sleeve is exposed outside of the potting box.

In one embodiment of the present disclosure, a method of assembling a transformer comprises providing a potting box; receiving at least two windings in the potting box; and encapsulating the potting container with a first potting sealant. The windings and a portion of the silicone rubber heat-shrinkable sleeve are encapsulated in the potting box and another portion of the silicone rubber heat-shrinkable sleeve is exposed outside of the potting box. Each of the windings includes at least one lead-out wire wrapped in a silicone rubber heat-shrinkable sleeve.

In one embodiment of the present disclosure, a transformer comprises at least two windings and each of the windings includes at least one lead-out wire. A portion of the lead-out wires is encapsulated in the potting box with a first potting sealant. A first portion of the first potting sealant is shaped by the potting box and a second portion of the first potting sealant is shaped as an insulator and located outside of the potting box. Another portion of the lead-out wires is exposed outside of the first potting sealant.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1:
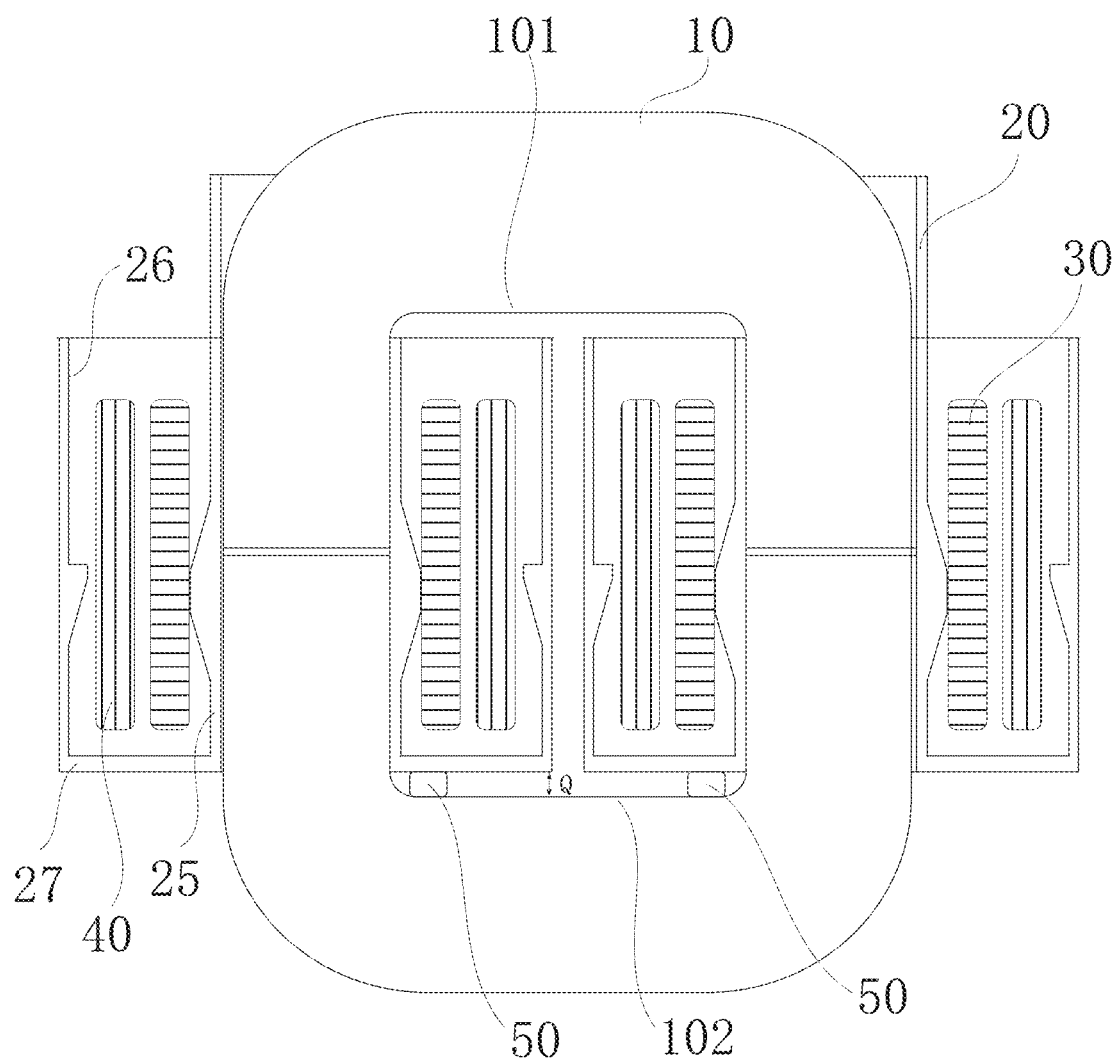
FIG. 1 is a cross-sectional view of a transformer of a first embodiment of the present disclosure.

FIG. 1 is a cross-sectional view of a transformer of a first embodiment of the present disclosure. As shown in FIG. 1, a transformer of the present disclosure includes an iron core 10, a support module, a winding unit and a potting box 20. The winding unit includes at least two windings. e.g. a first winding 40 (a high-voltage winding) and a second winding 30 (a low-voltage winding). The potting box 20 includes an inner wall 25 (such as a tubular shape), an outer wall 26 (such as a tubular shape) and a bottom plate 27. The tubular inner wall 25 is sleeved in the tubular outer wall 26. The bottom plate 27 is connected to a bottom portion of the tubular inner wall 25 and a bottom portion of the tubular outer wall 26 to form a potting space. In this embodiment, the tubular inner wall 25 and the tubular outer wall 26 are square but is not limited herein. In some embodiments, the tubular inner wall 25 and the tubular outer wall 26 are cylindrical. In some other embodiments, the tubular inner wall 25 and the tubular outer wall 26 are runway.

The first winding 40 and the second winding 30 are respectively disposed in a corresponding potting space. The first winding 40 is disposed on an inner side of the tubular outer wall 26. The second winding 30 is disposed on an outer side of the tubular inner wall 25. Two support modules 50 are respectively disposed between at least one end surface of the corresponding potting box 20 and a cover of the corresponding iron core 10, and close to a side of the tubular inner wall 25 of the potting box 20. Therefore, an insulation distance between the at least one end surface of the potting box 20 and the cover of the corresponding iron core 10 is formed and an air gap Q is formed between the at least one end surface of the potting box 20 and the cover of the corresponding iron core 10. In this embodiment, the insulation performance of the air gap Q is determined by the insulation distance (ie, the air gap Q), created by the support module 50, between the potting box 20 and the cover plate of the iron core 10. The larger the air gap Q is, the better the insulation effect is.

It should be noted that covers 101 and 102 of the iron core 10 indicate portions of the iron core, which are parallel with a bottom of the potting box 20. The cover of the iron core, in some embodiments, and a magnetic pole of the iron core are formed by integrated molding process. In some embodiments, the cover of the iron core is a single plate. The single plate and a magnetic pole form the iron core. In some embodiments, the at least one end surface of the potting box includes a first end surface or a second end surface. The first end surface is a lower surface of the bottom plate 27. The first support module 50 is disposed between the first end surface and the cover 102 of the corresponding iron core 10, and below the second winding 30. Therefore, an insulation distance between the potting box 20 and the cover 102 of the corresponding iron core 10 is formed and an air gap Q is formed between the potting box 20 and the cover of the corresponding iron core 10. In the present disclosure, the support modules, located above and below the low-voltage winding, is used to expand a space between the cover of the iron core and the potting box and to form a larger insulation distance. Therefore, an air gap is formed between the cover of the iron core and the potting box and the electric field strength is then reduced. The insulation performance of the high-voltage transformer is improved.

Figure 2:
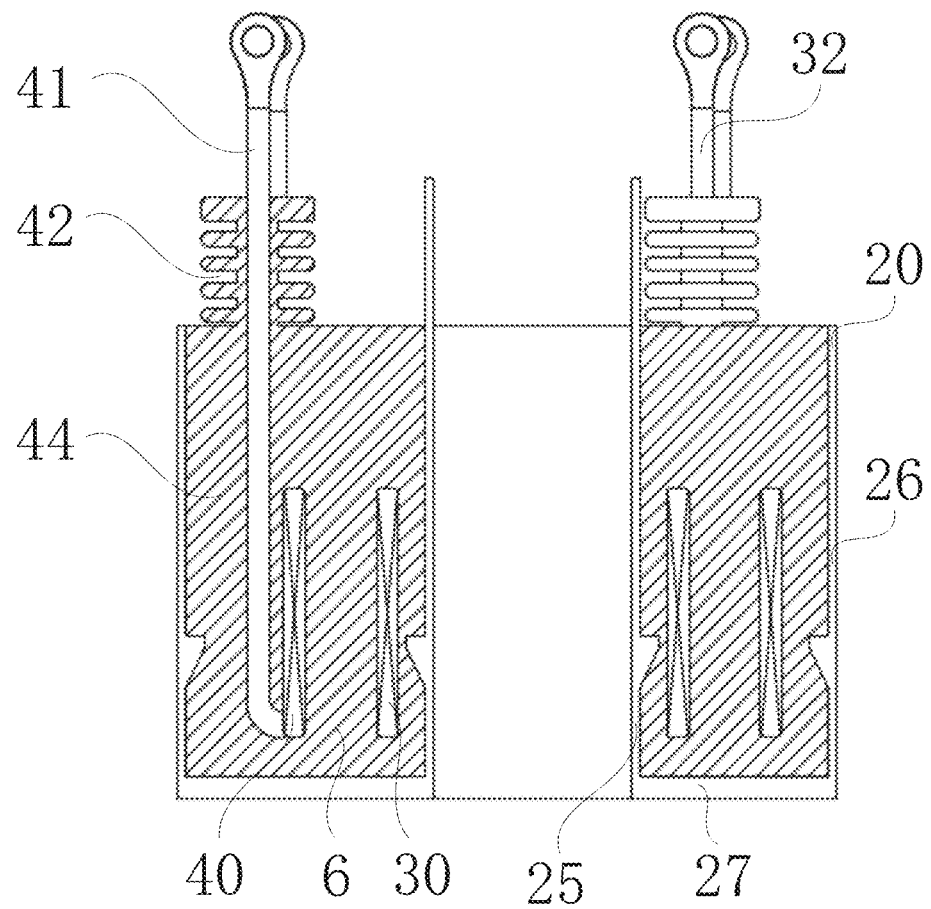
FIG. 2 is a cross-sectional view of a lead-out wire of a first embodiment of a transformer of the present disclosure.

FIG. 2 is a cross-sectional view of a lead-out wire of a first embodiment of a transformer of the present disclosure. As shown in FIG. 2, in this embodiment, the first winding 40 includes at least one lead-out wire 41. The second winding 30 includes at least one lead-out wire 32. In this embodiment, two lead-out wires 41 are respectively connected to the circuit on the high-voltage side. Two lead-out wires 32 are respectively connected to the circuit on the low-voltage side. The first winding 40 is disposed on the inner side of the tubular outer wall 26 of the corresponding potting box 20. The second winding 30 is disposed on the outer side of the tubular inner wall 25 of the corresponding potting box 20. The second winding 30 is a low-voltage winding and the first winding 40 is a high-voltage winding. The second winding 30 has the same electrical potential as the iron core 10. The at least end surface of the potting box includes a first end surface or a second end surface. The first end surface is a lower surface of the bottom plate 27. The second end surface is an upper surface of a potting cover or an upper surface of a second potting sealant 43 (referring to FIG. 3).

A portion of the lead-out wires 41 of the first winding 40 and the first winding 40 is encapsulated in the corresponding potting box 20 by the first potting sealant. Another portion of the leading wires 41 is exposed outside the corresponding first potting sealant.

A portion of the lead-out wires 32 of the second winding 30 and the second winding 30 is encapsulated in the corresponding potting box 20 by the first potting sealant. Another portion of the leading wires 32 is exposed outside the corresponding first potting sealant. As shown in FIG. 2, an inner side of the tubular inner wall of the potting box allows the magnetic pole of the iron core, referring to FIG. 1, to go through. In this embodiment, the lead-out wires 32 of the second windings are at a location close to the magnetic pole of the iron core. The lead-out wires 41 of the first windings are at a location away from the magnetic pole of the iron core.

For example, a first portion of the lead-out wires 41 of the first winding 40 is encapsulated in the potting box 20 by the first potting sealant. The first potting sealant includes a first portion of the first potting sealant 44 in the potting box 20 and a second portion of the first potting sealant, as an insulator, exposed outside of the potting box 20. Another portion of the lead-out wires 41 penetrates from the second portion 42 of the first potting sealant and is exposed outside of the first potting sealant. In this embodiment, the electrical potential of the low-voltage lead-out wires of the second windings 30 is similar to the potential of the iron core. The required insulation distance of the second winding 30 may be shorter. A certain insulation distance between the high-voltage lead-out wires of the first winding 40 and the iron core is required for meeting the insulation requirements.

In this embodiment, Shore hardness of the first potting sealant is in a range of A30 to A40 but is not limited herein. The soft potting sealant, disclosed by the present disclosure, has better insulation performance, which improves the insulation performance of the lead out wire of the high-voltage winding and the lead out wire of the low-voltage winding. Moreover, in this embodiment, since the second portion 42 of the first potting sealant replaces the ceramic sleeve, the corresponding installation for installing fixing devices are eliminated. Therefore, the structure becomes simple and the volume of the lead out wires is then reduced.

In this embodiment, the upper surface of the first portion 44 of the first potting sealant is aligned to the end surface of the opening of the potting box. The transformer further includes a potting cover. The potting cover is disposed on the end surface of the opening of the potting box and the potting cover includes through holes. The lead-out wires of the high-voltage winding and the lead-out wires of the low-voltage winding go through the through holes. Moreover, since the diameter of some of the through holes is greater than the diameter of the lead-out wires and the space between the through holes and the lead-out wires of the windings are filled with the second portion of the first potting sealant, the insulation performance of the lead-out wires of the windings is improved.

In this embodiment, the inner side of the tubular outer wall 26 has a first support portion for supporting the first winding 40 and the outer side of the tubular inner wall 25 has a second support portion for supporting the second winding 30. The first support portion is a first support shoulder, a protrusion of the inner perimeter of the tubular outer wall 26. The outer perimeter of the first winding 40 is bonded to the first support shoulder. The second support portion is a second support shoulder, a protrusion of the outer perimeter of the tubular inner wall 25. The inner perimeter of the second winding 30 is bonded to the second support shoulder. The first winding 40 and the second winding 30 are suspended by the first and second supporting portions so as to form an insulating clearance to the bottom plate 27. The height of the first support shoulder is equal to the height of the second support shoulder, but it is not limited thereto.

Referring to FIG. 2, the present disclosure discloses a method of manufacturing a transformer. As shown in FIG. 2, a potting box 20 is provided. Each of the at least two windings includes at least one lead-out wire 41. The winding is wound before been disposed in the potting box 20. A portion of the lead-out wires of the windings and the windings are encapsulated in the potting box 20 by the first potting sealant and another portion of the lead-out wires are exposed out of the potting box 20. The first potting sealant includes a first portion 44 of the first potting sealant and a second portion, exposed outside the potting box, of the first potting sealant. The second portion of the first potting sealant is an insulator. The transformer, manufactured by the method disclosed by the present disclosure, has better insulation performance and fully protected lead-out wires.

In some embodiments, Shore hardness of the first potting sealant is in a range of A30 to A40.

Figure 3:
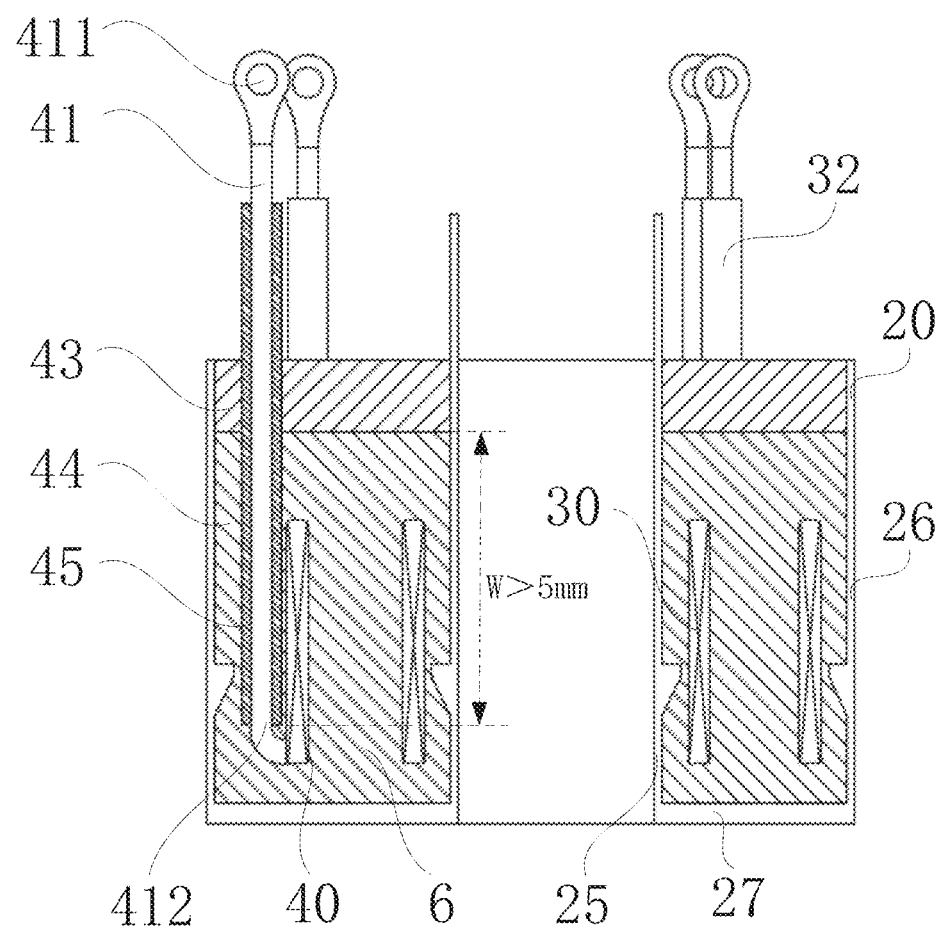
FIG. 3 is a cross-sectional view of a lead-out wire of a second embodiment of a transformer of the present disclosure.

FIG. 3 is a cross-sectional view of a lead-out wire of a second embodiment of a transformer of the present disclosure. As shown in FIG. 3, in this embodiment, the transformer of the present disclosure further includes a first potting sealant and a second potting sealant 43. The winding unit is encapsulated in a space with a first potting sealant, and the second potting sealant 43 is potting in a space between the first potting sealant and an end surface of an opening of the potting box 20. The outer peripheral of lead-out wire 41 of the first winding 40 is wrapped in a silicone rubber heat-shrinkable sleeve 45. A portion of the silicone rubber heat-shrinkable sleeve 45 is encapsulated in the potting box by the first potting sealant and the second potting sealant. Another portion of the silicone rubber heat-shrinkable sleeve 45 is exposed outside the corresponding second potting sealant. In this embodiment, a distance W between the upper surface of the first potting sealant and a lower end of the silicone rubber heat-shrinkable sleeve is greater than 5 mm but is not limited herein.

The outer peripheral of lead-out wire 32 of the second winding 30 is wrapped in a silicone rubber heat-shrinkable sleeve. A portion of the silicone rubber heat-shrinkable sleeve is encapsulated in the potting box 20 by the first potting sealant and the second potting sealant. Another portion of the silicone rubber heat-shrinkable sleeve is exposed outside the corresponding second potting sealant. In this embodiment, Shore hardness of the first potting sealant, as a soft potting sealant, is in a range of A30 to A40 but is not limited herein. Moreover, Shore hardness of the second potting sealant 43, as a hard potting sealant, is in a range of D70 to D90 but is not limited herein. In this embodiment, the outer peripheral of the lead-out wires of the high voltage winding and the low voltage winding are respectively wrapped in the silicone rubber heat-shrinkable sleeve. The silicone rubber heat-shrinkable sleeve is hermetically bonded with the soft potting sealant and the silicone rubber heat-shrinkable sleeve is fixed via the hard potting sealant. In the embodiments, the material of the soft potting sealant and the hard potting sealant are not limited herein. In this embodiment, a thickness of the second potting sealant 43 is greater than 2 mm.

The hard potting sealant of the present disclosure is used to fix the lead-out wire and protect the soft potting sealant, which enhance the mechanical performance and reliability of the high-voltage lead-out wire.

In some embodiments, the transformer of the present disclosure further includes the first potting sealant and a potting cover. The winding unit is encapsulated, by the first potting sealant, in a potting space. The upper surface of the first potting sealant is aligned to the end surface of the opening of the potting box. The potting cover is disposed on the end surface of the opening of the potting box and the potting cover includes through holes. The lead-out wires of the winding module go through the through holes. In this embodiment, Shore hardness of the first potting sealant, as a soft potting sealant, is in a range of A30 to A40 but is not limited herein. The outer peripheral of the lead-out wires 41 of the first winding 40 is wrapped in the silicone rubber heat-shrinkable sleeve 45. A portion of the silicone rubber heat-shrinkable sleeve 45 is encapsulated in the potting box 20 by the first potting sealant. Another portion of the silicone rubber heat-shrinkable sleeve 45 is exposed outside the potting cover. The outer peripheral of the lead-out wires 32 of the second winding 30 wrapped in the silicone rubber heat-shrinkable sleeve. A portion of the silicone rubber heat-shrinkable sleeve 45 is encapsulated in the potting box 20 by the first potting sealant. Another portion of the silicone rubber heat-shrinkable sleeve 45 is exposed outside the potting cover.

In some other embodiments, the transformer of the present disclosure further includes a first potting sealant, a second potting sealant and a potting cover. A winding unit is encapsulated in a potting space. The second potting sealant 43 is potting in a space between the first potting sealant and an end surface of an opening of the potting box 20. An upper surface of the second potting sealant is aligned to the end surface of the opening of the potting box. The potting cover is disposed on the end surface of the opening of the potting box and the potting cover includes through holes. The lead-out wires of the winding module go through the through holes.

In the present disclosure, the silicon rubber heat-shrinkable sleeve, as an insulation material, has great insulation performance. The silicon rubber heat-shrinkable sleeve has better compatibility with the soft potting sealant, and has strong adhesion with the soft potting sealant. Moreover, the silicon rubber heat-shrinkable sleeve effectively avoids creepage occurrence by high voltage winding through the sleeve and the insulation performance of the high-voltage lead-out wires. The silicon rubber heat-shrinkable sleeve, for the high-voltage lead, replaces the ceramic sleeve, which is not necessary to install the corresponding fixing device. Moreover, the transformer, disclosed by the present disclosure, has a simple structure, that reduces the volume of the lead wire. The potting cover is used to fix the lead-out wires and protect the soft potting sealant. Therefore, the mechanical performance and reliability of the high-voltage lead-out wire are then improved.

In this embodiment, the lead-out wires of the low voltage winding are close to the electrical potential of the iron core. The required insulation distance may be shorter. The lead-out wires of the high voltage winding are distant from the iron core for a certain distance for meeting the requirements of insulation.

In one embodiment, at least one end surface of the potting box 20 includes a first end surface and a second end surface. The first end surface is a lower surface of the bottom plate 27. The second end surface is an upper surface of the potting cover. In some embodiments, the second end surface is an upper surface of the second potting sealant 43. Referring to FIG. 1, the support module includes a first support module 50, and the first support module 50 is disposed between the first end surface and the cover 102 of the corresponding iron core 10 (as shown in FIG. 1). Otherwise, the first support module 50 is disposed between the second end surface and the cover 101 of the corresponding iron core 10 (as shown in FIG. 1). In some embodiments, the first support module 50 (as shown in FIG. 1) is disposed between the first end surface and the cover of the corresponding iron core as well as disposed between the second surface and the cover of the corresponding iron core. Moreover, the first support module 50 (as shown in FIG. 1) is located on a side close to the tubular inner wall of the potting box, which means the first support module 50 is close to the iron core. For example, in some embodiments, the first support module 50 (as shown in FIG. 1) is located under the first winding 30. In some embodiments, the first support module 50 (as shown in FIG. 1) is exactly located under the first winding 30.

The leading direction of the lead-out wires of the potting box 20 is optional. For example, the lead-out wires of the high voltage winding and the lead-out wires of the low voltage winding may be leaded out from the upper portion of the potting box 20. In some embodiments, the lead-out wires are leaded out from the middle portion of the potting box. In some embodiments, the lead-out wires are leaded out from the lower portion of the potting box.

In one embodiment, the tubular outer wall of the potting box 20 includes at least one first through hole and the lead-out wires of the windings pass through the corresponding first through hole but is not limited herein. In another embodiment, the bottom plate of the boxing 20 includes at least one second through hole and the lead-out wires of the windings pass through the corresponding second through hole but is not limited herein.

As shown in FIG. 3, the present disclosure discloses a method of manufacturing a transformer. As shown in FIG. 3, a potting box 20 is provided. The potting box 20 is receiving at least two windings. Each of the windings includes at least one lead-out wire 41. The outer peripheral of lead-out wire 41 of the first winding 40 is wrapped in a silicone rubber heat-shrinkable sleeve 45. A portion of the silicone rubber heat-shrinkable sleeve 45 and the windings are encapsulated in the potting box 20 by the first potting sealant and another portion of the silicone rubber heat-shrinkable sleeve 45 is exposed out of the potting box 20. The second potting sealant 43 is encapsulated in a space between the end surface of the opening of the potting box and the first potting sealant. In some embodiments, the first potting sealant is potting in the potting space and the upper surface of the first potting sealant is aligned to the end surface of the opening of the potting box. Moreover, a potting cover is disposed on the end surface of the opening of the potting box. The transformer, manufactured by the method disclosed by the present disclosure, has great insulation performance and fully protected lead-out wires.

In some embodiments of the present disclosure, Shore hardness of the second potting sealant 43 is in a range of D70 to D90.

Figure 4:
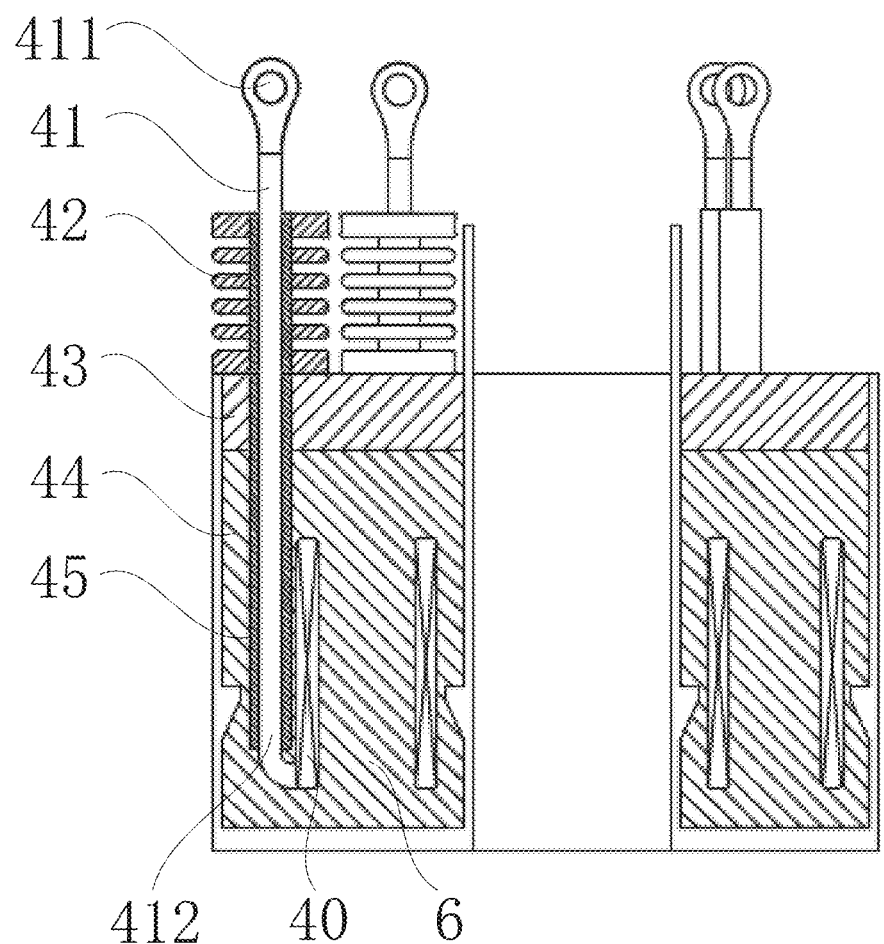
FIG. 4 is a cross-sectional view of a lead-out wire of a third embodiment of a transformer of the present disclosure.

FIG. 4 is a cross-sectional view of a lead-out wire of a third embodiment of a transformer of the present disclosure. As shown in FIG. 4, in this embodiment, the first potting sealant and the second potting sealant are used. The winding unit is encapsulated in the potting space by the first potting sealant. The second potting sealant 43 is potting in a space between the first potting sealant and the end surface of the opening of the potting box 20. An insulator is disposed on the second potting sealant 43 to protect the lead-out wires and the silicone rubber heat-shrinkable sleeve 45. The material of the insulator is same as the material of the first potting sealant. In some embodiments, the material of the insulator is same as the material of the second potting sealant 43 but is not limited herein. The structure of FIG. 4 is a combination of the structure of FIG. 2 and the structure of FIG. 3 and the related features are not repeated herein.

In the present disclosure, there is no special position requirement for the silicone rubber heat-shrinkable sleeve, wrapped on the high voltage wires and low voltage lead wires, and the windings. The depth of an ordinary silicone rubber heat-shrinkable sleeve is greater than the upper end portion of the winding. A distance between the upper surface of the soft potting sealant and the lower end portion of the silicone rubber heat-shrinkable sleeve is greater than 5 mm. Due to the requirements of various voltage level, the distance, 5 mm, is not limited herein. In order to fix lead-out wires of the windings and protect soft potting sealant, a thickness of the hard potting sealant is greater than 2 mm but is not limited herein.

Figure 5:
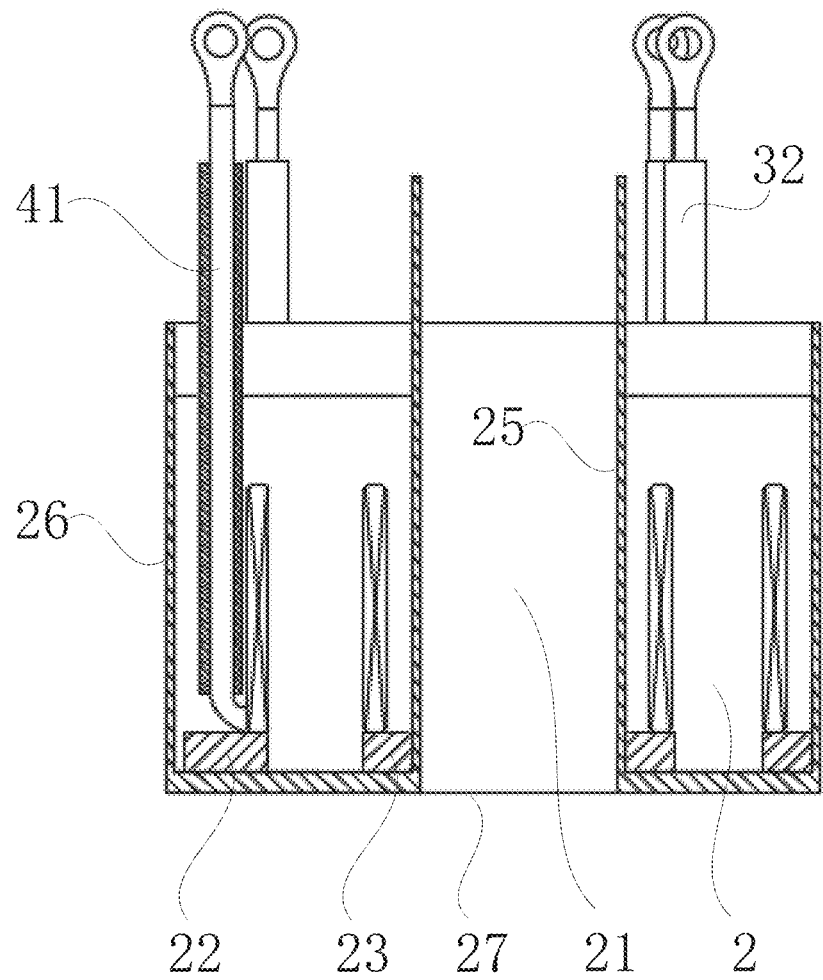
FIG. 5 is a cross-sectional view of a potting box of a first embodiment of a potting box of a transformer of the present disclosure.
Figure 6:
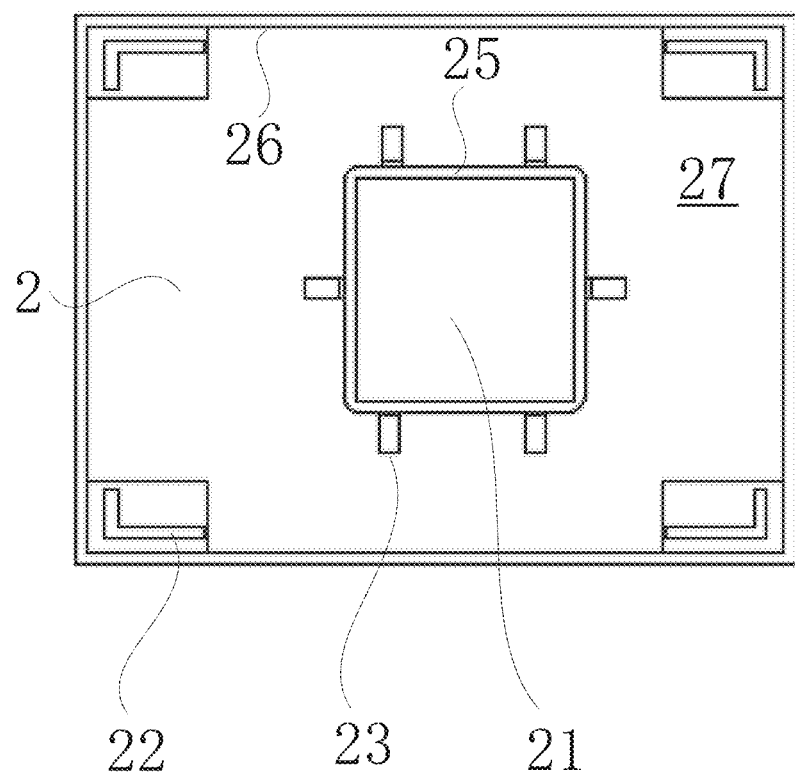
FIG. 6 is a top view of FIG. 5.

FIG. 5 is a cross-sectional view of a potting box of a first embodiment of a potting box of a transformer of the present disclosure. FIG. 6 is a top view of FIG. 5. As shown in FIGS. 5 and 6, in this embodiment, the winding of the transformer is wound with multi-strand wires, a single-strand wire, or a copper foil, and is fixed and formed in a self-adhesive or dipping manner. Therefore, the winding bobbin is not necessary. The first winding 40 and the second winding 30 are disposed in the potting box, as shown in FIG. 6, and the bottom portion supports the windings. The inner side of the tubular outer wall 26 includes a first support portion for supporting the first winding 40. The outer side of the tubular inner wall 25 includes a second support portion for supporting the second winding 30. The first support portion includes a plurality of first shoulders 22 protruded, from the extension portion of the bottom plate 27 of the potting box 20, toward the opening of the potting box 20.

The end portion of the first winding 40 is crimped to the first shoulder 22. The second support portion includes a plurality of second shoulders 23 protruded, from the extension portion of the bottom plate 27 of the potting box 20, toward the opening of the potting box 20. The end portion of the second winding 30 is crimped to the second shoulder 23. The respective height of the first shoulder 22 and the second shoulder 23 is equal to a distance between the first winding 40 and the second winding 30. The first shoulders 22 and the second shoulders 23 are a plurality of support points distributed on the bottom plate 27, which allow the high-voltage winding and the low-voltage winding to be stably disposed on the first shoulders 22 and the second shoulders 23, respectively. The height of the first shoulder 22 may be equal to the height of the second shoulder 23. In this embodiment, the low-voltage winding is supported by the shoulders located at inner side and the high-voltage winding is supported by the shoulders located at outer side. The height of the shoulder is about equal to a distance between the high-voltage winding and the low-voltage winding. With the optimizing location design at the bottom portion of the potting box, the first shoulders 22 and the second shoulders 23 provides reliable support. Since the creepage distance of the high-voltage winding and the low-voltage winding is increased, the insulation performance of the encapsulated high-voltage winding and the encapsulated low-voltage winding may improve. The first shoulder 22, the second shoulder 23 and the potting box, in some embodiment, are formed by integrated molding process. In some embodiments, the first shoulder 22 and the second shoulder 23 are fixed on the bottom plate by a bonding method.

Figure 7:
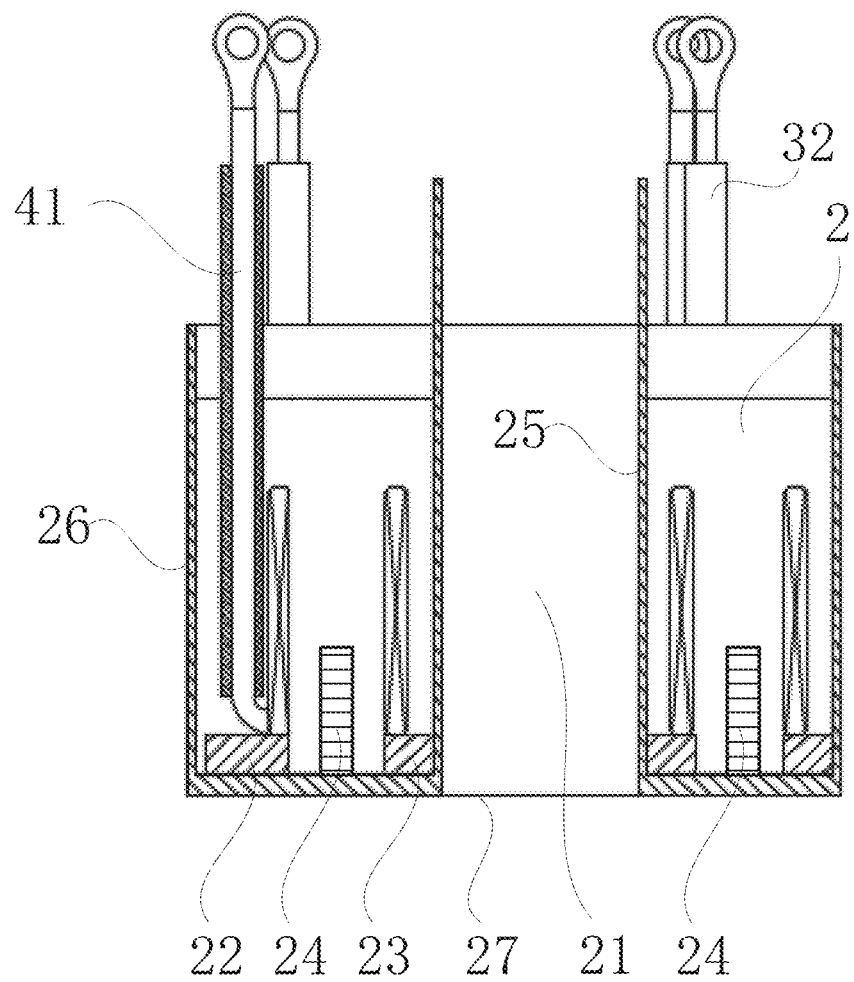
FIG. 7 is a cross-sectional view of a potting box of a second embodiment of a potting box of a transformer of the present disclosure.
Figure 8:
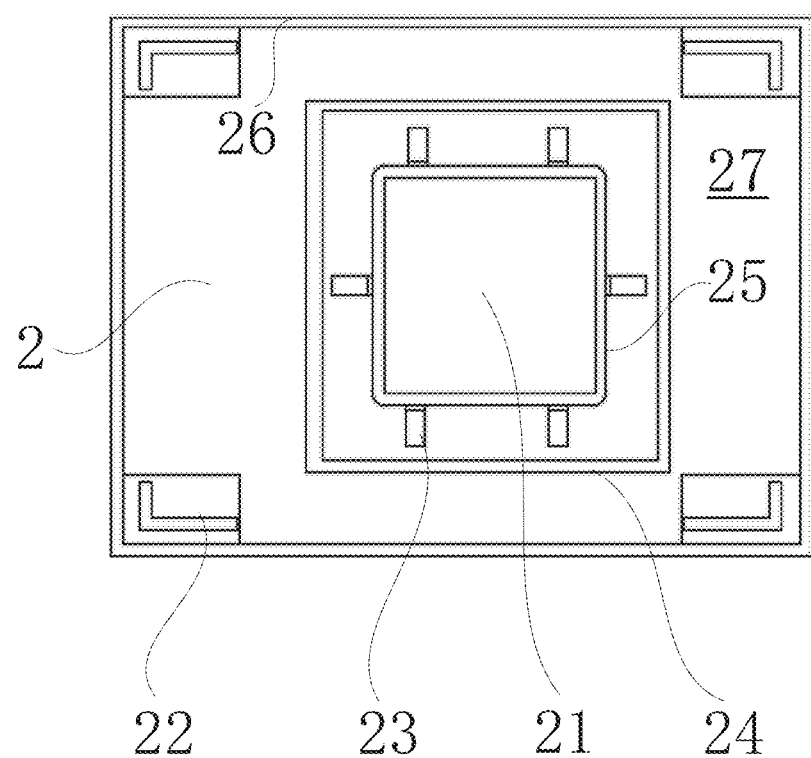
FIG. 8 is a top view of FIG. 7.

FIG. 7 is a cross-sectional view of a potting box of a second embodiment of a potting box of a transformer of the present disclosure. FIG. 8 is a top view of FIG. 7. As shown in FIGS. 7 and 8, the inner side of the tubular outer wall 26 includes a first support portion for supporting the first winding 40. The outer side of the tubular inner wall 25 includes a second support portion for supporting the second winding 30. The first support portion includes a plurality of first shoulders 22 protruded, from the extension portion of the bottom plate 27 of the potting box 20, toward the opening of the potting box 20. The end portion of the first winding 40 is crimped to the first shoulder 22. The second support portion includes a plurality of second shoulders 23 protruded, from the extension portion of the bottom plate 27 of the potting box 20, toward the opening of the potting box 20. The end portion of the second winding 30 is crimped to the second shoulder 23. The respective height of the first shoulder 22 and the second shoulder 23 may be equal to a distance between the first winding 40 and the second winding 30. Moreover, at least one wall 24 are protruded, from the bottom plate 27 located between the first shoulder 22 and the second shoulder 23, toward the opening of the potting box 20. In this embodiment, the wall 24 is a wall with a runway shape wall. The protruding direction of the wall 24 is parallel to the protruding direction of the first shoulder 22 and the second shoulder 23. The height of the wall 24 is no larger than the height of the first shoulder 22 or the height of the second shoulder 23. In this embodiment, the transformer is similar to the transformer of FIGS. 5 and 6 but further includes at least one wall 24. As shown in FIGS. 7 and 8, the height of the wall 24 located between the first shoulder 22 and the shoulder 23 is smaller than the height of the first shoulder 22 or the height of the second shoulder 23 and the shape of the wall is not limited. In the present disclosure, in some embodiments, the transformer includes several sets of intersecting walls, which will effectively increase the creepage distance between the high-voltage winding and the low-voltage winding. The insulation performance of the encapsulated windings is then improved.

Figure 9:
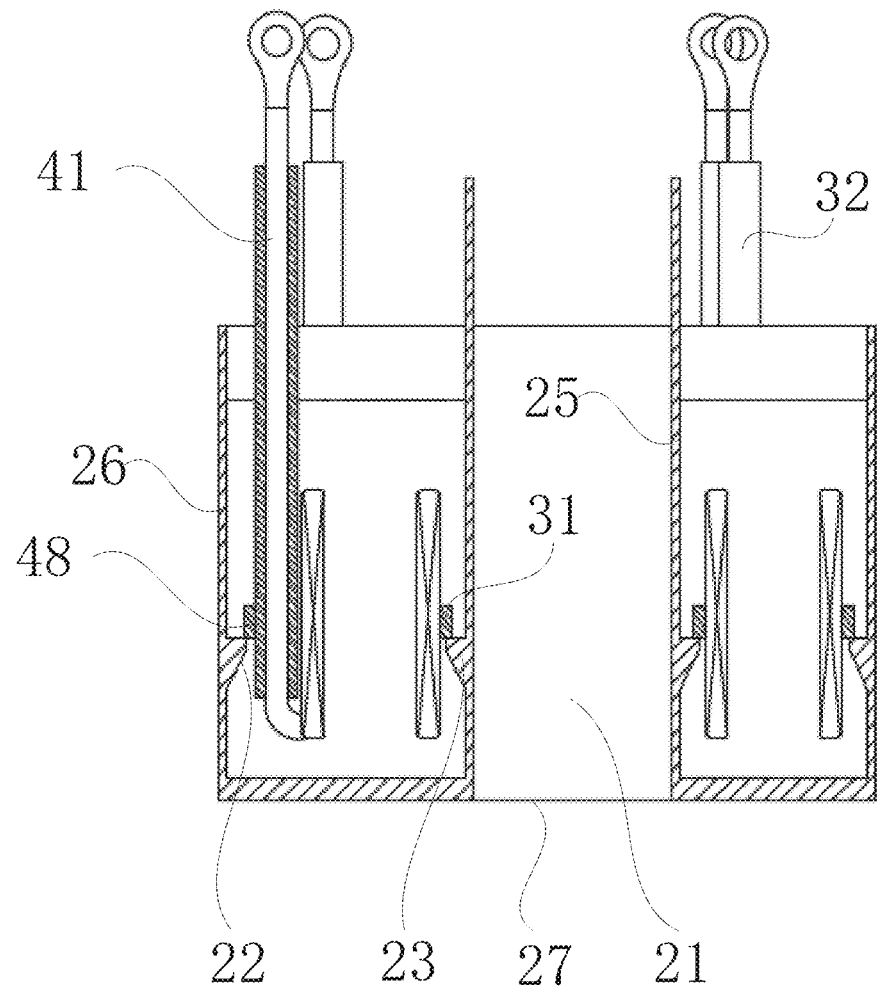
FIG. 9 is a cross-sectional view of a potting box of a third embodiment of a potting box of a transformer of the present disclosure.
Figure 10:
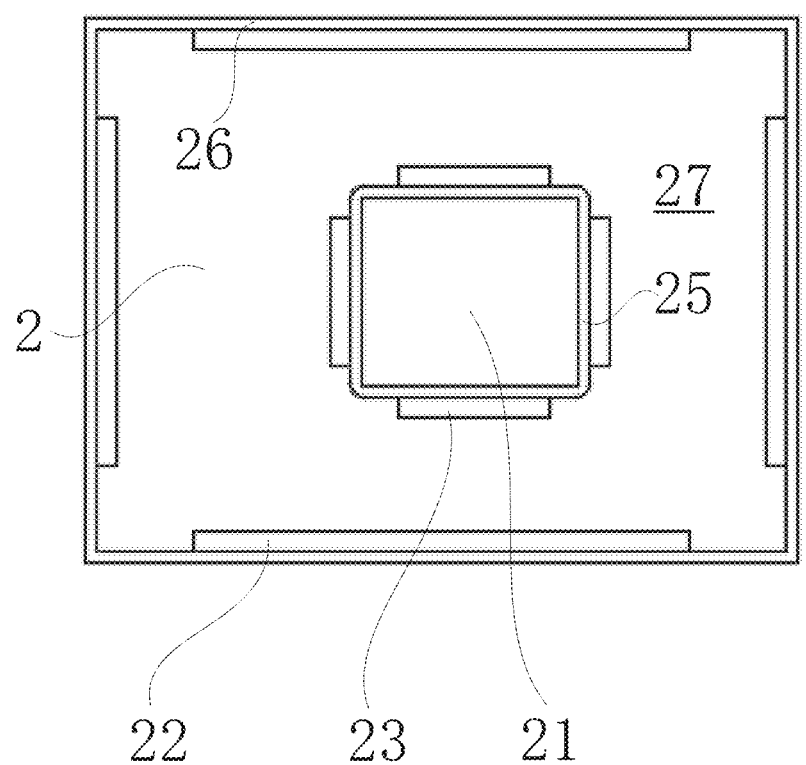
FIG. 10 is a top view of FIG. 9.

FIG. 9 is a cross-sectional view of a potting box of a third embodiment of a potting box of a transformer of the present disclosure. FIG. 10 is a top view of FIG. 9. As shown in FIGS. 9 and 10, in this embodiment, the winding of the transformer is wound with multi-strand wires, a single-strand wire, or a copper foil, and is fixed and formed in a self-adhesive or dipping manner. Therefore, the winding bobbin is not necessary. The windings are disposed in the potting box and, as shown in FIG. 10, supported by bars placed in the middle portion of potting box, so as to be suspended from the bottom plate. In this embodiment, a support bar is fixed at the middle portion of the high-voltage winding and the low voltage winding. The middle portion of inner side of the tubular outer wall and the middle portion of the outer side of the tubular inner wall includes a support shoulder. The high-voltage winding and the low-voltage winding are all fixed, by the support bar located at the middle portion of the winding, on the support shoulder of the middle portion of the potting box but is not limited herein.

In this embodiment, the first support portion includes a plurality of first shoulders protruded from the inner side of the tubular outer wall. The first winding 40 includes a main body and a first support bar 48 surrounding the outer side of the main body. The first support bar 48 is crimped to the support shoulder. The second support portion includes a plurality of second shoulders protruded from the outer side of the tubular inner wall 25. The second winding 30 includes a main body and a second support bar 31 surrounding the inner side of the main body of the second winding 30. The second support bar 31 is crimped to the support shoulder. The first winding 40, the second winding 30 and the bottom plate 27 are suspended to form an insulation clearance. The height of the insulation clearance is equal to a distance between the first winding 40 and the second winding 30. In this embodiment, the first support shoulder and the second support shoulder are located at the middle portion of the potting box. Compared with the way of bottom portion support, the electric field strength between the high-voltage winding and the low-voltage winding is then improved and creepage distance is increased. The insulation performance of the encapsulated windings and wires is improved.

In some embodiments, the potting box, in the present disclosure, includes a combination of bottom portion support of FIG. 6 (or FIG. 8) and middle portion support of FIG. 10. For example, the inner side of the tubular outer wall adopts the way of bottom portion support and the outer side of the tubular inner wall adopts the way of middle portion support and is not limited herein. In some embodiments, the way of suspension is adopted. In some embodiments, the potting box includes at least two encapsulated high-voltage windings and low-voltage windings.

Figure 11:
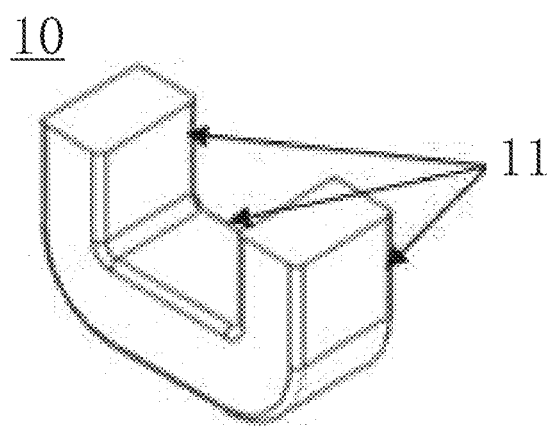
FIG. 11 is a schematic view of an iron core of a transformer of the present disclosure.

FIG. 11 is a schematic view of an iron core of a transformer of the present disclosure. As shown in FIG. 11, at least one magnetic pole of the iron core 10, in this embodiment the present disclosure, includes a chamfer 11. In some embodiments, the cover of the iron core 10 includes a chamfer 11. The chamfer 11 has a radius greater than 1 mm. In this embodiment, the magnetic pole of the iron core and the cover include a chamfer. The radius of the chamfer is greater than 1 mm due to the size requirement of the chamfer. Therefore, the chamfer is able to reduce the non-uniformity of the electric field built from the iron core to the high-voltage winding and the low-voltage winding. The partial discharge (PD) voltage of the transformer is reduced and the insulation performance of the transformer is improved.

In some embodiments of the present disclosure, the transformer is not limited to the combination of a U-shaped iron core and two potting boxes 20. The followings, FIG. 12 and FIG. 13, further illustrate some embodiments of the present disclosure.

Figure 12:
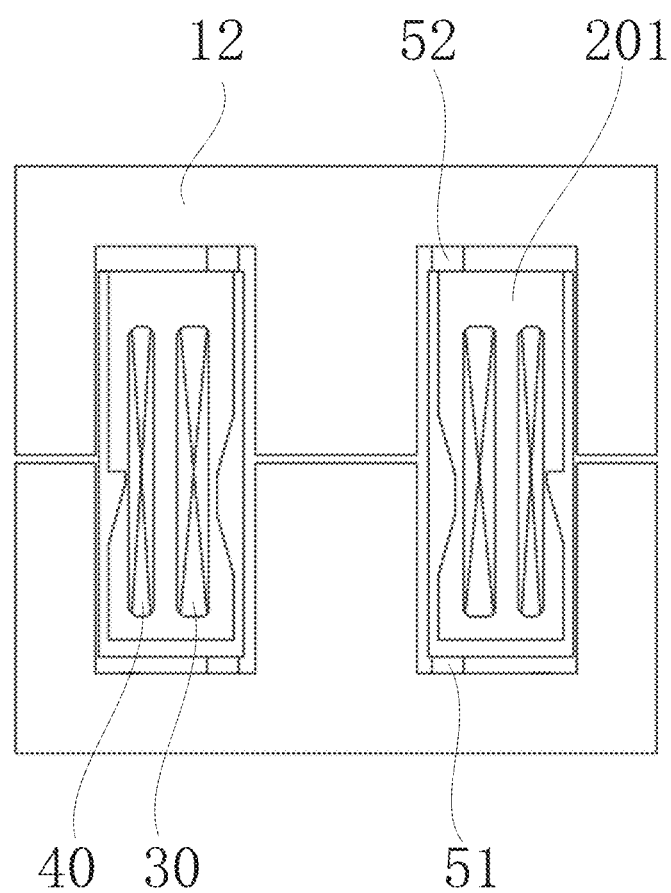
FIG. 12 is a cross-sectional view of a second embodiment of a transformer of the present disclosure.

FIG. 12 is a cross-sectional view of a second embodiment of a transformer of the present disclosure. As shown in FIG. 12, in the present disclosure, the iron core used in a medium and high voltage transformer is an EE iron core. The middle pole, the side pole and the cover of the iron core include at least one chamfer. The potting box 20 of the medium and high voltage transformer includes a low-voltage winding close to the middle pole of the iron core and a high-voltage winding away from the middle pole of the iron core. In some embodiments, the potting box 20 of the medium and high voltage transformer includes a high-voltage winding close to the middle pole of the iron core and a low-voltage winding away from the middle pole of the iron core. After the windings are encapsulated in the potting box by the potting sealant, the two E iron core face each other and the middle pole of the EE iron core goes through the inner side 21 of the tubular inner wall of the potting box. There is a support module 51, located at a location under and close to the middle pole winding of the iron core, disposed between a first end surface of the potting box and the cover corresponding to the iron core. Moreover, in some embodiments, there is further a support module 52 located between a second end surface of the potting box and the cover corresponding to the iron core. The support module, in some embodiments, includes other structural forms, e.g. the support module is formed with the potting box by integrated molding process. As long as the potting box is distant from the cover of the iron core a certain distance as an insulation clearance. As shown in FIG. 12, the low-voltage winding 30 is disposed on a side close to the middle pole in the potting box 20. The high-voltage winding 40 is disposed on a side away from the middle pole in the potting box 20. Moreover, in this embodiment, an insulation structure is used to separate the iron core and the potting box 20 and the electric field strength is then reduced. The insulation performance of the high-voltage transformer is improved.

Figure 13:
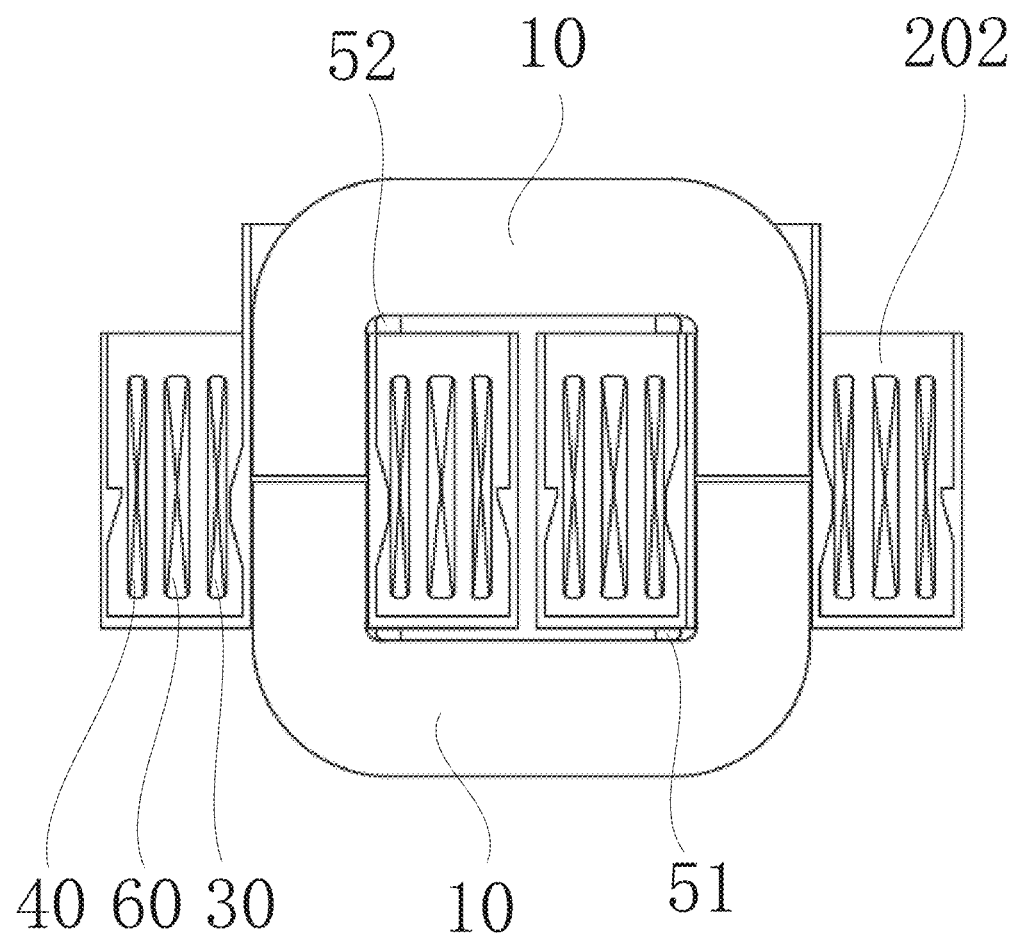
FIG. 13 is a cross-sectional view of a third embodiment of a transformer of the present disclosure.

FIG. 13 is a cross-sectional view of a third embodiment of a transformer of the present disclosure. As shown in FIG. 13, the transformer, in the present disclosure, includes two potting boxes 20, a winding unit and iron cores 10. The iron core includes two U shape cores and at least one support module (such as support module 51, support module 52). The two U shape cores face each other to form a runway shape core. Two magnetic poles of the two U shape cores are respectively go through the inner side 21 of the tubular inner wall of the two potting box 20. Each of the support modules is disposed between the end surface of the corresponding potting box 20 and the cover of the corresponding U shape core. The two potting boxes 20 are formed by integrated molding process. The winding module includes a first winding 40, a second winding 30 and a third winding 60. The first winding 40 is disposed on the inner side of the tubular outer wall 26 of the corresponding potting box 20. The second winding 30 is disposed on the outer side of the tubular inner wall 25 of the corresponding potting box 20. The third winding 60 is disposed between the first winding 40 and the second winding 30. The first winding 40 and the second winding 30 are high-voltage windings. The third winding 60 is a low-voltage winding. The transformers of the present disclosure are bilateral symmetry. The high-voltage windings of the transformer are connected in series and the low-voltage windings are connected in parallel. Therefore, the connection structure of the windings in the present disclosure greatly reduces leakage inductance and is implemented on a high frequency circuit being sensitive to leakage inductance.

In some embodiments, the transformer of the present disclosure includes a potting box 20. The iron core 10 includes two U shape core. The two U shape cores face each other to form a runway shape core. A magnetic pole of the two U shape cores goes through the inner side 21 of the tubular inner wall 25 of the potting box 20.

In some embodiments, the iron core includes two E shape cores. The transformer includes three potting boxes 20 and the two E shape cores face each other. Each of the magnetic poles of the two E shape cores respectively goes through the inner side of the corresponding tubular inner wall 25 of the potting box. The three potting boxes are formed by integrated molding process but is not limited herein.

An insulating structure, disclosed by the present disclosure, created by the support module, located above and under the low-voltage winding, and the chamfer of the magnetic pole are able to reduce the non-uniformity of the electric field and improve the insulation performance of the high-voltage high-frequency transformer. The volume of the transformer is then reduced and the cost is reduced as well. In the present disclosure, the insulation between the iron core and the high voltage winding of the transformer is a multi-layer composite insulation structure. With the combination of potting sealants, potting boxes and air gap, the insulation performance is improved.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A transformer, comprising:
at least two windings, wherein each of the at least two windings comprises at least one lead-out wire, and a silicone rubber heat-shrinkable sleeve is wrapped around the outer surface of the lead-out wire;
wherein the at least two windings and a portion of the silicone rubber heat-shrinkable sleeve are encapsulated in a potting box with a first potting sealant, and another portion of the silicone rubber heat-shrinkable sleeve is exposed outside of the potting box;
wherein, the potting box includes an inner wall, an outer wall and a bottom plate, at least one of the inner wall and the outer wall of the potting box includes at least one support shoulder and/or the bottom plate of the potting box includes shoulders, at least one of the windings is suspended inside the potting box by the at least one support shoulder or the shoulders.

2. The transformer of claim 1 further comprising a second potting sealant being encapsulated in a space between the first potting sealant and an end surface corresponding to an opening of the potting box.

3. The transformer of claim 1, wherein Shore hardness of the first potting sealant is in a range of A30 to A40.

4. The transformer of claim 2, wherein Shore hardness of the second potting sealant is in a range of D70 to D90.

5. The transformer of claim 1,
wherein the bottom plate is connected to a bottom portion of the inner wall and a bottom portion of the outer wall;
wherein both an inner side of the outer wall and an outer side of the inner wall include the at least one support shoulder;

wherein both an outer perimeter of one of the at least two windings and an inner perimeter of another of the at least two windings include support bars; and wherein the support bar is crimped to the corresponding support shoulder to form an insulation clearance between the at least two windings and the bottom plate.

6. The transformer of claim 1, wherein the bottom plate including the shoulders is connected to a bottom portion of the inner wall and a bottom portion of the outer wall;

wherein the shoulders are protruded toward an opening of the potting box, and each of the at least two windings is crimped to the corresponding shoulder.

7. The transformer of claim 1, wherein the bottom plate is connected to a bottom portion of the inner wall and a bottom portion of the outer wall;

wherein an inner side of the outer wall or an outer side of the inner wall includes the at least one support shoulder, and the bottom plate includes the shoulders, wherein the shoulders of the bottom plate are protruded toward an opening of the potting box;

wherein an outer perimeter or an inner perimeter of at least one winding includes a support bar, and the support bar is crimped to the corresponding support shoulder and is suspended inside the potting box, and at least another winding is crimped to the shoulders of the bottom plate.

8. The transformer of claim 1, wherein the bottom plate is connected to a bottom portion of the inner wall and a bottom portion of the outer wall;

wherein both an inner side of the outer wall and an outer side of the inner wall include the at least one support shoulder;

wherein an outer perimeter of one of the at least two windings and an inner perimeter of another of the at least two windings are respectively contacted with the corresponding support shoulders to form an insulation clearance between the at least two windings and the bottom plate.

9. The transformer of claim 8, wherein the transformer includes an iron core, and a magnetic post of the iron core passes through the inner side of the inner wall of the potting box.

10. The transformer of claim 9, wherein the at least two windings include a low-voltage winding and a high-voltage winding; and wherein the low-voltage winding is disposed on the outer side of the inner wall of the potting box and the high-voltage winding is disposed on the inner side of the outer wall of the potting box.

11. The transformer of claim 10, wherein a lead-out wire of the low-voltage winding is close to the iron core and a lead-out wire of the high-voltage winding is away from the iron core.

12. The transformer of claim 2, wherein a thickness of the second potting sealant is greater than 2 mm.

13. The transformer of claim 1, wherein a distance between the upper surface of the first potting sealant and a lower end of the silicone rubber heat-shrinkable sleeve is greater than 5 mm.

14. A transformer, comprising:
at least two windings, wherein each of the at least two windings includes at least one lead-out wire;
wherein a portion of the lead-out wires is encapsulated in a potting box with a first potting sealant, and another portion of the lead-out wires is exposed outside of the first potting sealant;
wherein a first portion of the first potting sealant is shaped by the potting box and a second portion of the first potting sealant is shaped as an insulator and located outside of the potting box;
wherein, the potting box includes an inner wall, an outer wall and a bottom plate, at least one of the inner wall and the outer wall of the potting box includes at least one support shoulder and/or the bottom plate of the potting box includes shoulders, at least one of the windings is suspended inside the potting box by the at least one support shoulder or the shoulders.

* * * * *